219-121 CROSS REFERENCE SEARCH ROOM
Sept. 24, 1968 J. F. SMITH 3,402,460
ATTACHMENT OF LEADS TO SEMICONDUCTORS
Filed May 26, 1965
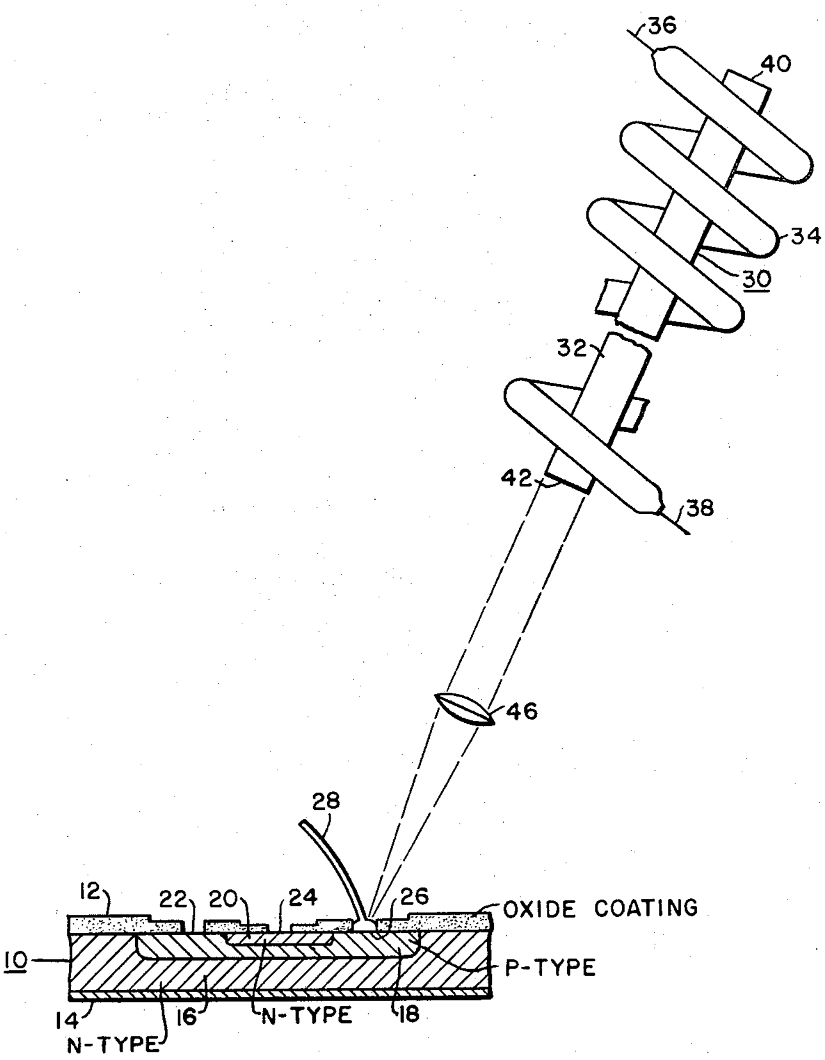
WITNESSES:
Leon M. Garman
James F. Young
INVENTOR
James F. Smith
BY Gordon H. Telfer
ATTORNEY 3,402,460
Patented Sept. 24, 1968

3,402,460

ATTACHMENT OF LEADS TO SEMICONDUCTORS

James F. Smith, Poughkeepsie, N.Y., assignor to Westinghouse Electric Corporation, Pittsburgh, Pa., a corporation of Pennsylvania Filed May 26, 1965, Ser. No. 458,867
2 Claims. (Cl. 29—589)

This invention relates to a method for bonding metallic elements such as electrical leads to semiconductive wafers and the like. More particularly, the invention relates to a method employing a coherent beam of light energy emitted from a laser for bonding electrical leads to exposed areas of a silicon wafer.

While not limited thereto, the present invention is particularly adapted for use in the manufacture of molecular semiconductor devices such as molecular blocks, integrated circuits, functional electronic blocks, and the like. In such device, it is often necessary to attach very small electrical leads, as small as 0.0002 inch in diameter, to small areas on the substrate of the devices. In the past, such leads have been secured to semiconductive wafers by thermocompression bonding, soldering and other similar processes. For small contact areas, thermocompression bonding has been regarded as the most acceptable method; however, this method has certain disadavntages. That is, in thermocompression techniques, bond strengths are not always as strong as the lead wire; adhesion to the substrate is not always uniform; and when gold leads are bonded to aluminum films on the semiconductor wafer, pre-heating of the substrate sometimes results in an undesirable bluish intermetallic compound of gold and aluminum.

Recently, attempts have been made to attach leads to semiconductive wafers, particularly silicon wafers, by the use of a coherent beam of light emitted by a laser. As is well known, lasers operate on the principle of stimulated emission of electromagnetic wave energy. Classically, the phenomenon can be summarized as related to the pumping of electrons, or rather their spin energy levels, to an excited energy state above their normal or ground energy level. Thus, the electrons surrounding the nucleus of an atom in a paramagnetic material may exist in different energy states, or energy spin states; and the energy levels of these states may be raised by an external wave energy field which is pumped into the paramagnetic material. After the energy levels of the electron spins are raised to an excited state above their normal or ground level, they may revert back to the ground level, whereupon the energy absorbed in the pumping process is liberated; and, in the passage of such liberated energy quanta through the laser material, an orientation and accretion of such energy occurs until it is emitted as a coherent beam of specific wavelength. Thus, the light beam emitted by the laser is monochromatic or of specific wavelength and, because of its coherency, diverges to a very small degree. Consequently, the laser beam can be focused into a very small spot of high energy intensity capable of melting most metals.

In the most common type of laser, a host material in single crystal form is doped with a paramagnetic ion and cut to a length preferably equal to an even multiple of the wavelength which is intended to be amplified. One end of the crystal is totally reflecting and the other end is partially reflecting only. By pumping light energies into the single crystal by means of a helical flashtube or the like, an oscillation of a single wavelength can be built up between the reflecting ends of the crystal; and since one of the ends is only partly reflecting, a portion of the amplified wave energy will pass therethrough as the aforesaid coherent light beam of extremely high intensity.

Previous attempts with coherent light beams for bonding electrical leads to silicon wafers involved the use of a laser in which the aforesaid single crystal comprises ruby, and in which the intense coherent energy output of the laser is focused through a lens to increase the power density.

While at least partially satisfactory results are achieved with the use of a ruby laser for attaching leads to silicon wafers, certain difficulties are present, The primary difficulty is the high absorption coefficient and low reflectivity of silicon at 6943 A. (i.e., 0.6943 microns), the emitted wavelength of ruby, and the difficulty of obtaining a lens with a sufficiently long focal length to produce a very small beam diameter on the workpiece. If the focal length of the lens is too short, the lens becomes coated with metallic vapors during the lead attachment process. On the other hand, if the focal length of the lens is sufficiently long to avoid coating with metallic vapors, then the spot diameter of the laser beam becomes large enough that a good portion of the beam is incident on the silicon substrate. When the energy output of the laser is sufficiently great enough to penetrate the lead material and form a bond between the lead and the substrate, then the portion of the silicon substrate exposed to the beam will absorb enough energy to create thermal damage therein due to localized heating. This problem can be alleviated by evaporating an aluminum film on the silicon substrate such that the higher reflectivity of the exposed aluminum film, being three times greater than that of silicon, reflects enough of the radiation to prevent thermal damage in the silicon.

While leads can be attached successfully to silicon wafers by use of an aluminum film in the manner described above, it is desirable in many cases to attach leads directly to the exposed silicon. The ruby laser is not adaptable for this purpose because of the high absorption coefficient and low reflectivity of the emitted wavelength of ruby as mentioned above.

The present invention resides in the dscovery that thermal damage to a semiconductive body or the like can be eliminated during bonding of a metallic member thereto by the use of a beam of coherent radiation having a wavelength at or near the critical wavelength for transparency of the body to which the metallic member is bonded. At the critical wavelength for transparency, determined by the absorption coefficient of the semiconductive body, the heat of the beam is not localized at the surface thereof, but rather penetrates into the interior. The result, of course, is a dissipation of the energy over a larger area, eliminating the thermal damage to an exposed semiconductor surface encountered with previous laser bonding techniques.

As an overall object, therefore, the present invention seeks to provide a method for bonding a metallic member to a semiconductive or the like body with the use of a beam of coherent radiation, but without causing localized thermal damage to the body to which the metallic member is bonded.

More specifically, an object of the invention is to provide a method for bonding electrical leads to semiconductive silicon wafers with the use of a coherent beam of radiation having a wavelength at or near the critical wavelength of silicon, whereby the portion of the laser beam directly incident on the silicon will be absorbed over a much greater depth than at wavelengths removed from the critical wavelength for silicon.

Still another object of the invention is to provide a method for bonding electrical leads to semiconductive materials with the use of a laser beam, wherein the focal length of lenses used to focus the beam on the area of bonding can be made sufficiently long to prevent coating with metallic vapors.

In accordance with one illustrative embodiment of the invention, a coherent beam of radiation, having a wavelength of about 1.06 microns (10600 A.) is emitted by a laser in which the paramagnetic ion is neodymium and the host material is glass, a single crystal of calcium tungstate or a single crystal of strontium molybdate. The laser rod is preferably pumped by means of a helical flashtube surrounding it, and the emitted beam of coherent radiation is focused by means of a lens system onto the area of contact between an exposed surface of a silicon wafer and an electrical lead. In this process, the energy of the beam will melt the lead and fuse it to the surface of the wafer. At the same time, the wave energy, being near the critical wavelength of the silicon (11000 A. or 1.1 microns), will penetrate deeply into the wafer rather than being concentrated at its surface to prevent thermal damage around the area of contact.

The above and other objects and features of the invention will become apparent from the following detailed description taken in connection with the accompanying single figure drawing which schematically illustrates an embodiment of the invention.

With reference now to the drawing, a single crystal of silicon 10 is shown having a layer of silicon dioxide 12 over most of its upper surface and a layer of electrical conductive material 14 covering the entirety of its lower surface. The single crystal of silicon 10 is formed by diffusion or other well-known techniques into three regions comprising a lower N-type region 16, an intermediate P-type region 18 and an upper N-type region 20. The upper oxide film 12 is interrupted as at 22, 24 and 26 to expose portions of the P-type region 18 and N-type region 20, respectively. These exposed areas are adapted for connection to electrical leads, one of which is indicated by the reference numeral 28.

The structure shown may be considered a bipolar transistor having collector, base and emitter regions 16, 18 and 20, respectively; or it may be considered a unipolar transistor having channel region 18 and gate regions 16 and 20 wherein contacts at positions 22 and 26 would act as source and drain. The structure, whether an individual device or part of an integrated circuit, is, of course, merely illustrative of those with which the invention may be practiced.

In certain cases, it is desirable to bond leads, such as lead 28, directly to the surface of the silicon wafer 10 at the area 22, 24 or 26. In the particular illustration given, the lead 28 is shown for connection to the exposed area 26 of P-type region 18. In order to generate heat and fuse or otherwise bond the lower end of lead 28 to the P-type region 18, a source of heat is necessary. This is provided in accordance with the present invention by means of a laser 30 which, in its simplest form, comprises a rod 32 of a host material doped with a paramagnetic ion. The host material of the laser rod 32 may comprise glass or it may comprise a single crystal of a material such as calcium tungstate or strontium molybdate. Surrounding the laser rod 32 is a helical flashtube 34 having leads 36 and 38 adapted for connection to a source of pulsed electrical energy. The flashtube 34 is preferably filled with xenon such that it will emit ultraviolet light which pumps energy into the laser rod 32. The upper end 40 of the laser rod 32 is silvered or otherwise rendered totally reflecting; whereas the lower end 42 is only partially reflecting, the length of the rod between the ends 40 and 42 being an even multiple of the wavelength which it is desired to amplify.

In the operation of the laser 30, a pulsed electrical potential is established between the leads 36 and 38 by known procedures. In this process, the xenon vapors within the flashtube 34 will ionize to produce an ultraviolet wave energy. This wave energy will impinge upon and be pumped into the laser rod 32 to raise the energy levels of the electron spins of the paramagnetic ions therein from a lower energy level to a higher energy level. When the energy level of the ions falls from the higher to the lower level, light will be emitted by the rod 32. Since the reflective ends 40 and 42 are separated by an amount equal to an even multiple of the desired emission wavelength, a resonant cavity effect is produced whereby a steady oscillation of a single wavelength is built up between the opposite ends 40 and 42. Since the lower end 42 is only partially reflecting, at least part of the light will pass therethrough as a coherent beam 44. This beam is focused by means of a lens 46 onto the area of contact between the lower end of lead 28 and the exposed area 26.

In accordance with the present invention, the laser rod 32 is doped with a paramagnetic material which will emit coherent light at a wavelength near the critical wavelength for transparency of the silicon wafer 10. In the particular illustration given herein, the rod 32 may comprise a host material such as glass, calcium tungstate or strontium molybdate doped with neodymium. Such a laser rod will emit light at 1.06 microns (i.e., 10600 A.). At this wavelength, the absorption coefficient of the silicon wafer 10 is relatively low, meaning that the light energy will not be concentrated at the surface of the exposed area 26 but will penetrate rather deeply down into the body of the silicon wafer 10. The result, of course, is that since the heat is not concentrated at the surface of area 26, the possibility of thermal damage to the silicon wafer 10 is eliminated, or at least greatly minimized.

While a neodymium-doped laser has been shown herein for purposes of illustration, it will be appreciated that other types of lasers can be employed, just so long as the emitted wavelength is above 1.0 micron, the longer the wavelength, the greater the penetrations depth. Below 1.0 micron, penetration depths are so small that excessive localized heating might occur as is the case with ruby lasers.

One important advantage of the invention is the fact that the focal length of lens 46 is not particularly critical. As was mentioned above, attempts were made with ruby lasers to make the focal length as short as possible in order to produce an extremely small energy spot concentrated on the lead itself without impingement on the silicon substrate. This, it was thought would alleviate the localized heating effects in silicon incident to the use of a laser having a wavelength removed from the critical wavelength of the silicon. However, a short focal length causes coating of the lens with metallic vapors as was mentioned above. Since localized heating of the silicon is eliminated by employing the principles of the present invention, impingement of the beam on the substrate becomes of secondary importance; and the focal length can be increased to eliminate the possibility of lens coating.

Although the invention has been shown in connection with a certain specific embodiment, it will be readily apparent to those skilled in the art that various changes may be made to suit requirements without departing from the spirit and scope of the invention. In this respect, it will be apparent that while the invention has been illustrated in connection with the bonding of an electrical lead to a semiconductive wafer, it has appliciation in any case where it is desired to bond one fusible member to another without generating excessive heat in one of the two members which are bonded together.

I claim as my invention:

1. In the method for bonding an electrical metallic conductor directly to an exposed area of a surface of a wafer of semiconductive silicon, the steps of positioning the electrical conductor over said exposed area and in direct contact therewith, generating a beam of coherent light having a wavelength above 1.0 micron, and focusing said beam of coherent light onto the exposed area of the wafer surface with the electrical conductor in direct contact with the wafer surface to thereby fuse the conductor directly to the silicon without creating excessive heat at the surface of the wafer.

2. In the method for bonding an electrical conductor to a wafer of semiconductive silicon, the steps of positioning the electrical conductor in contact with the semiconductive silicon wafer, pumping light energy into a neodymium laser rod doped with strontium molybdate, one end of said crystal being totally reflecting and the other end being partially reflecting whereby the crystal will emit coherent light at a wavelength of 1.06 microns, and focusing onto the area of contact between the semiconductive silicon material and said electrical conductor said beam of coherent light having a wavelength of 1.06 microns whereby the energy of the beam will be absorbed by the electrical conductor to melt it and fuse it to the semiconductive silicon material without causing thermal damage to the silicon material itself.

References Cited

UNITED STATES PATENTS 3,304,403 2/1967 Harper ............. 219—121

OTHER REFERENCES

Optical Maser Characteristics of $Nd^{3+}$ in $SrMoO_4$, Johnson and Soden, Journal of Applied Physics, v. 33, p. 757, 1962.

Maguire: Microwelding-Laser or Electron Beam; Electronics, July 5, 1963, pp. 23–25.

Maguire: Laser Welds Copper Leads; Electronics, Oct. 25, 1963, pp. 88–91.

Platte, Smith: Laser Techniques for Metals Joining, Welding Journal, v. 42, supp. 481–9, November 1963.

Sandford, Wenzel: Giant Pulse Laser Action and Pulse Width Narrowing in Neodymium-Doped Borate Class; J. Applied Physics, v. 35; 3422–3, November 1964.

Pfluger and Maas: Laser Beam Welding Electronic-Component Leads; Welding Journal, v. 44, supp. 264–9, June 1965. Note presentation May 8, 1964.

Price: Laser Welding of Semiconductor; Industrial Electronics, October 1964, pp. 478–9.

JOHN F. CAMPBELL, *Primary Examiner.*

J. L. CLINE, *Assistant Examiner.*